(12) United States Patent
Su

(10) Patent No.: US 7,401,007 B1
(45) Date of Patent: Jul. 15, 2008

(54) METHOD, COMPUTER PROGRAM AND APPARATUS FOR EXTRACTING LARGE SIZE SIGNAL DATA SAMPLES WITH AN AUTOMATICALLY ADJUSTED DECIMATION RATIO

(75) Inventor: Wei Su, Englishtown, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/712,163

(22) Filed: Feb. 28, 2007

Related U.S. Application Data

(63) Continuation-in-part of application No. 10/429,350, filed on Apr. 28, 2003, now abandoned.

(51) Int. Cl.
*G06F 19/00* (2006.01)
*G06F 17/40* (2006.01)

(52) U.S. Cl. .............. 702/189; 324/76.11; 324/76.12; 324/76.38; 340/500; 340/540; 340/657; 340/658; 340/659; 702/57; 702/66; 702/67; 702/68; 702/79

(58) Field of Classification Search .............. 324/76.11, 324/76.12, 76.38; 340/500, 531, 539.1, 540, 340/657, 658, 659, 679, 870.01, 870.07, 340/870.16, 870.28; 702/1, 57, 66, 67, 68, 702/70, 71, 75, 79, 127, 189, 190; 715/500, 715/526

See application file for complete search history.

(56) References Cited

U.S. PATENT DOCUMENTS

| | | | | |
|---|---|---|---|---|
| 3,551,891 A | * | 12/1970 | Klaus-Dietrich et al. | 703/13 |
| 5,499,110 A | * | 3/1996 | Hosogai | 358/450 |
| 5,502,789 A | * | 3/1996 | Akagiri | 704/204 |
| 5,528,356 A | * | 6/1996 | Harcourt | 356/73.1 |
| 5,917,733 A | * | 6/1999 | Bangham | 708/300 |
| 6,229,536 B1 | * | 5/2001 | Alexander et al. | 345/440.1 |
| 6,559,868 B2 | * | 5/2003 | Alexander et al. | 715/781 |
| 6,567,760 B1 | * | 5/2003 | Kikuchi et al. | 702/67 |

(Continued)

FOREIGN PATENT DOCUMENTS

JP 2001-283536 A * 10/2001

*Primary Examiner*—Edward R Cosimano
(74) *Attorney, Agent, or Firm*—Michael Zelenka; George B. Tereschuk

(57) ABSTRACT

A method for rapidly extracting data file samples with an a signal monitor and an automatically adjusted decimation ratio is provided to solve the long-standing problems caused by large data files and small buffers by reducing a large data segment to a smaller, more manageable size automatically so that a lower resolution version of the data segment will be loaded into a fixed-size small buffer in the computer's working space buffer for further data editing. In accordance with the methods of this invention, the segment size will vary during the operation of a means for zooming-in and the decimation ratio is updated and adjusted automatically based on the variation of segment size. The present invention insures that the best resolution of the data segment will be achieved when fitting the varying large size data segment into the fixed small size buffer. The present invention also provides a storage medium encoded with machine-readable computer program code for rapidly extracting data files with an automatically adjusted decimation ratio and an apparatus for rapidly analyzing and editing data files with an automatically adjusted decimation ratio.

20 Claims, 11 Drawing Sheets

U.S. PATENT DOCUMENTS

| | | | |
|---|---|---|---|
| 6,989,833 B2 * | 1/2006 | Narita | 345/440.1 |
| 7,010,551 B2 * | 3/2006 | Terayama et al. | 707/200 |
| 2002/0049777 A1 * | 4/2002 | Terayama et al. | 707/200 |
| 2002/0080149 A1 * | 6/2002 | Alexander et al. | 345/634 |
| 2003/0071832 A1 * | 4/2003 | Branson | 345/698 |
| 2003/0179242 A1 * | 9/2003 | Alexander et al. | 345/781 |
| 2004/0017366 A1 * | 1/2004 | Narita | 345/208 |
| 2004/0164984 A1 * | 8/2004 | Pickerd | 345/440 |

* cited by examiner

TIME DOMAIN DISPLAY OF RAW DATA

FREQUENCY DOMAIN DISPLAY OF HEAD SEQUENCE

FREQUENCY DOMAIN DISPLAY OF NOISE

FREQUENCY DOMAIN DISPLAY OF DESIRED SIGNAL

IN-PHASE-AND-QUADRATURE DISPLAY OF DESIRED SIGNAL

METHOD, COMPUTER PROGRAM AND APPARATUS FOR EXTRACTING LARGE SIZE SIGNAL DATA SAMPLES WITH AN AUTOMATICALLY ADJUSTED DECIMATION RATIO

CONTINUATION-IN-PART

This application is a Continuation-In-Part of U.S. Patent and Trademark Office application Ser. No. 10/429,350 now abandoned entitled, "Method, Computer Program And Apparatus To Analyze Large Size Signal Data Samples In A Small Buffer Using An Automatically Adjusted Decimation Ratio," filed on Apr. 28, 2003 by the same inventor. This Continuation-In-Part is being filed under 37 CFR. § 1.53 and priority from the April 28, 2003 effective date of the Parent Case (Ser. No. 10/429,350) is hereby claimed.

GOVERNMENT INTEREST

The invention described herein may be manufactured, used, imported, sold, and licensed by or for the Government of the United States of America without the payment to me of any royalty thereon.

FIELD OF THE INVENTION

The invention generally relates to the sampling, collecting, extraction and analysis of data files of communication signals with uncertain contents. In particular, the invention relates to signal monitoring apparatus and methods that rapidly extract, analyze and edit data samples with an automatically adjusted decimation ratio.

BACKGROUND OF THE INVENTION

Communication signal data collection is an increasingly important aspect of situational awareness, surveillance, spectrum monitoring and signal analysis with both military and civilian applications. Most recorded communication signal files have a very large data size due to the over-sampling in collection and massive recording of signal data with uncertain contents. Generally, some current computer or signal processing equipments or software afford only a very limited buffer size for data processing. Due to an order of magnitude size disparity between large communication signal files and limited data processing buffer sizes, the review, extraction, editing and search of the desired signal section in any large communication signal data file with uncertain contents is often a very lengthy, time-consuming and inefficient process. Additionally, the search and tailor procedures employed by the user are also quite labor intensive. Typically, a tedious and time-consuming repeated prescreen routine requires a user to load the large data file piece by piece into a small buffer for review until the user finally finds the desired data sample segment. One illustrative example of the disparity between the size of a large data signal file and a limited size working space buffer is 10 GB vs. 10 MB. Since the file content is unknown, the piece-by-piece loading and analysis is subject to human error and may miss the desired section.

Thus, there has been a long-felt need of software or hardware for processes and techniques that overcome the problems, disadvantages, limitations and shortcomings of Communication signal data collection techniques that require loading large data files piece-by-piece into a small buffer for further processing. An automated decimation method is needed to extract, edit or tailor large files efficiently in a fixed-size small buffer. The signal monitoring apparatus and methods using automated decimation ratios will satisfy the long-felt need for processes, apparatus and software that overcome the numerous problems, disadvantages, limitations and shortcomings of loading large data files into small buffer areas and the subsequent manual search during communication signal data collection. The present invention provides signal monitoring techniques for extracting data signal samples using an automatically adjusted decimation ratio provide a low resolution preview of the signal envelope, zoom in to the signal section of interest using the Graphic User's Interface (GUI) until getting desired resolution for extracting, analyzing and editing data files. The software and devices automatically adjust a decimation ratio that decimates, or trims, the size of the desired large data segment by reducing the over-sampling rate in order to fit into the buffer for further data processing, without suffering from the disadvantages, shortcomings and limitations of prior art techniques and devices.

SUMMARY OF THE INVENTION

It is an object of the present invention to provide a signal monitoring apparatus for rapidly extracting and editing data files with an automatically adjusted decimation ratio that decimates the data file segment, provides an adjustable resolution data file segment and identifies the unknown communication signal.

Another object of the present invention is to provide a method to rapidly extract the desired signal segment from the large file of the over-sampled signal of uncertain contents and edit the data files by automatically decimating the data file sampling rate to better fit the signal into the working space buffer for further analysis and identification.

It is also an object of the present invention to provide a storage medium encoded with machine-readable computer program code with GUI for rapidly extracting and editing data files, including signal data files of uncertain contents, with an automatically adjusted decimation ratio that decimates the data file to a lower resolution in order to better fit into the working space buffer. Then, zoom in to the desired segment using QUI to provide a higher resolution data file segment. The resolution or sampling rate is adjusted automatically with zoom-in and zoom-out operation performed by GUI until the desired signal section is found and extracted and the Nyquist sampling rate is satisfied.

These and other objects and advantages can now be attained by this invention's signal monitoring methods for rapidly extracting and editing data files with an automatically adjusted decimation ratio, comprising the steps of collecting the communication signal with uncertain contents, defining a maximum size segment, measuring the given data file size, calculating a decimation ratio permitting the data file to fit into the working space buffer, loading the decimated data file into the working space buffer, analyze the decimated data by editing the data based on the signal envelop, extracting a desired waveform segment with a means for zooming-in to the desired section with a higher resolution. Those are implemented by calculating a starting sample and an ending sample, decimating rates, and processing the multiple loading steps.

The methods and other embodiments of the present invention will be implemented as a GUI based hardware or software to solve the long-standing problem of large data files and small buffers by reducing a large data segment to a smaller, more manageable size automatically so that a lower resolution version of the data segment will be loaded into a fixed-size small buffer in the computer's working space buffer for further data editing. The segment resolution will vary during the operation of the zooming-in means and the decimation ratio is updated and adjusted automatically based on the variation of segment size. The extracting, decimating and loading process can be repeated until the user finds the desired data waveform segment with the requisite resolution, or sampling rate. The methods of the present invention insure that the best resolution of the extracted data segment will be achieved for analysis and editing when fitting the varying large size data segment into the fixed small size buffer. The present invention also contemplates a signal monitoring device with a storage medium encoded with machine-readable computer program code for rapidly extracting and editing data files with an automatically adjusted decimation ratio and a signal monitoring apparatus for rapidly extracting and editing data files with an automatically adjusted decimation ratio.

DETAILED DESCRIPTION OF THE DRAWINGS

Figure 1:
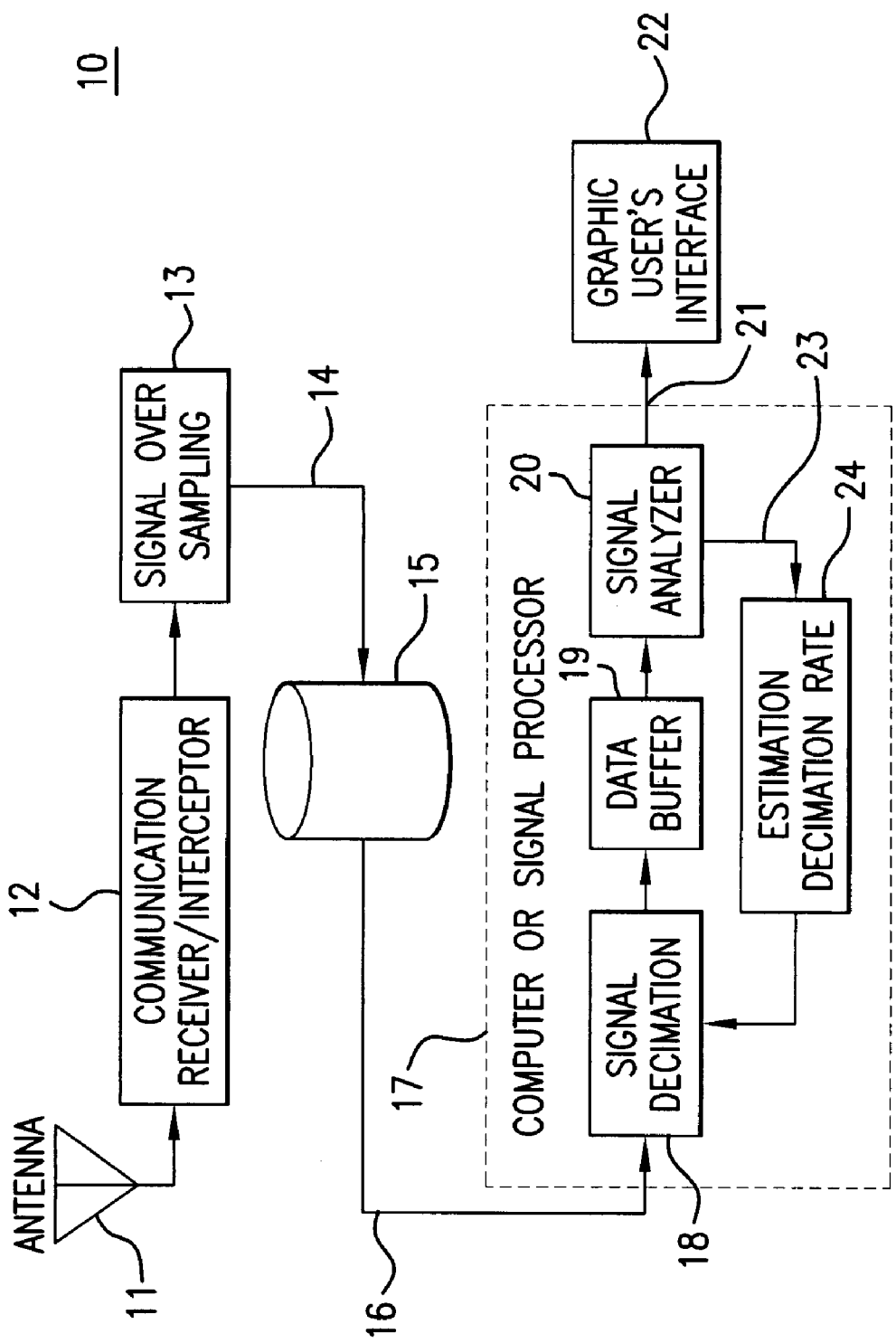
FIG. 1 is a block diagram illustrating this invention's signal monitoring device to extract data file samples extraction.

Communication signal data collection is an important part of battlefield surveillance, spectrum monitoring, and signal analysis and there has been a long-felt need for signal monitoring systems that provide for rapid extraction and editing of data files to identify an unknown signals. FIG. 1 depicts a signal monitoring device for extracting data signal samples using an automatically adjusted decimation ratio, a means for zooming in to the signal section of interest, a GUI and a means to display the desired data file segment. This invention's method, devices and software automatically adjust a decimation ratio that decimates, or trims, the size of the desired large data segment by reducing the over-sampling rate allowing for identification of the unknown signal, without suffering from the disadvantages, shortcomings and limitations of prior art techniques and devices.

Figure 2:
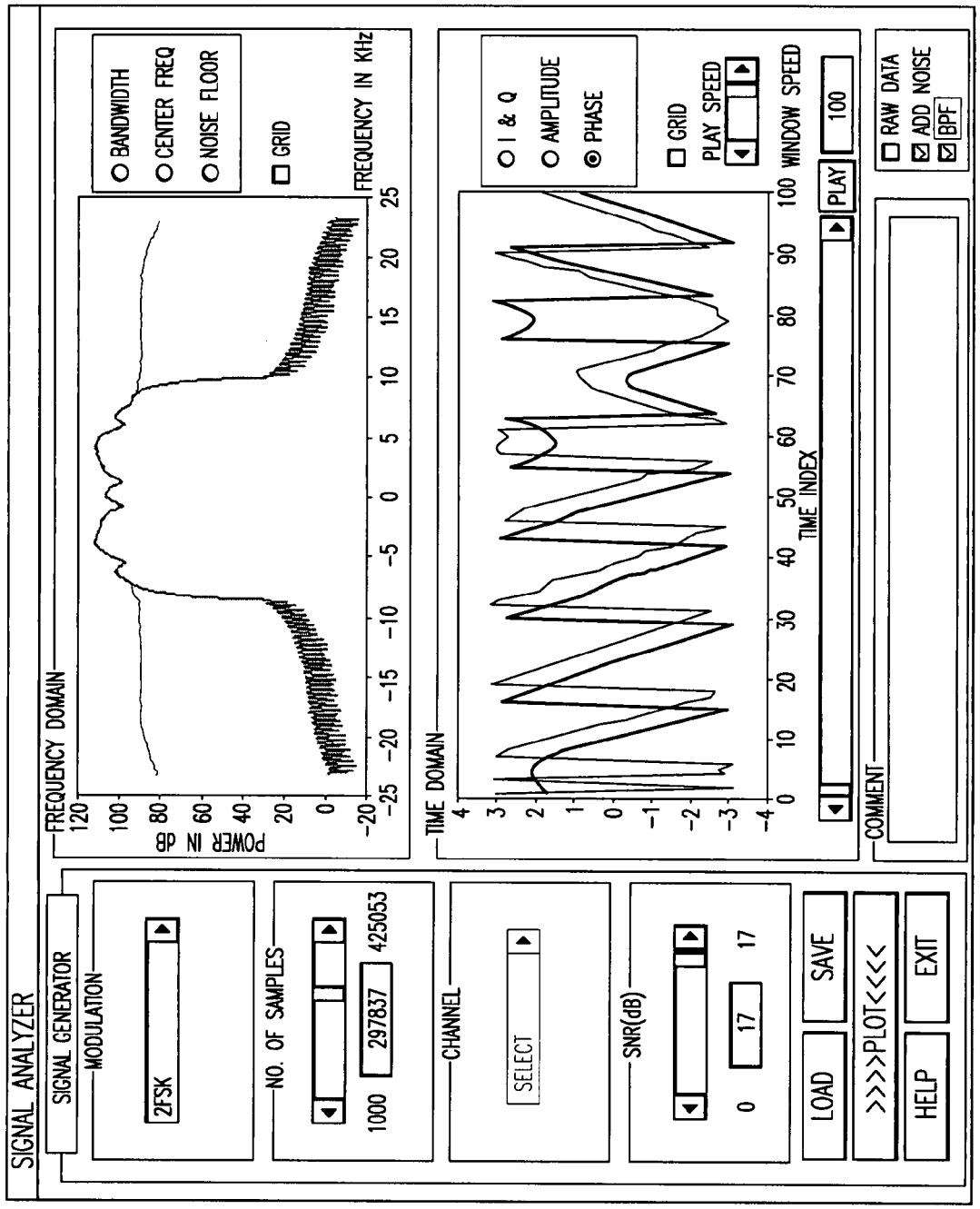
FIG. 2 is an example of the Graphic User Interface (GUI) used in operation of the data file sample extraction of this invention.

Referring now to FIG. 1, there is depicted a signal monitoring device 10, comprising an antenna 11 and communication receiver 12 to collect the signal with unknown contents. Since the signal collection is non-cooperative and the signal format and contents are unknown, a means for over-sampling 13 is needed during digitization of the analog data to insure that no information is lost during data file extraction and signal analysis. A digitized data sample, represented by arrow 14, is usually very large in size and is stored in a means for data storage 15. In many occasions, the desired signal section to be extracted is very small in size as compared to the recorded signal data. However, to extract the small desired signal data section from the large storage using prior art review techniques is very time-consuming and labor-intensive. This invention's signal monitor with rapid data extraction allows large size data analysis to occur in real-time within a limited size buffer by loading the large signal data with proper decimation rate in order to provide the best signal resolution in the limited buffer space. A stored digitized data sample, represented by arrow 16, is sent to a means for data processing 17. The data processing means 17 further comprises a signal decimation module 18, data buffer 19 and a signal analyzer 20. The signal analyzer 20 provides a signal analysis output, represented by arrow 21, to a Graphic Users Interface (GUI) 22. The GUI 22, which is also depicted in FIG. 2, illustrates the signal analysis operation of this invention's signal monitor 10. The FIG. 2 GUI reports the maximum number of samples allowing the user to define the staring and ending samples of the signal data. The FIG. 2 GUI plots the loaded data in both the frequency domain and time domain. Referring back to FIG. 1, the signal analyzer 20 also provides a decimation rate output 23 to a means for decimating data files 24 which will be described in greater detail below, and ultimately allows the user can zoom-in to, and extract, the desired signal section for analysis. The GUI also includes many other functions beyond the scope of this invention.

The signal monitor of the present invention can also include a number of variations. For example variations such as decimation rate, decimating and loading operations as needed to achieve a more refined resolution, extracting and analyzing real data, calculating a real data decimation ratio $R_1$, extracting and analyzing complex data, calculating a complex data decimation ratio $R_2$ and so forth are considered within the contemplation of the present invention. Additionally, the signal monitor of the present invention also contemplate rapidly extracting and editing both data file samples and data signal samples. When the data file is a data signal file, the desired data segment is a desired waveform segment, the decimated data segment is a decimated waveform segment and the improved resolution data segment is an improved resolution data signal segment. Also, the communications receiver 12 can be an interceptor with an antenna.

Figure 3:
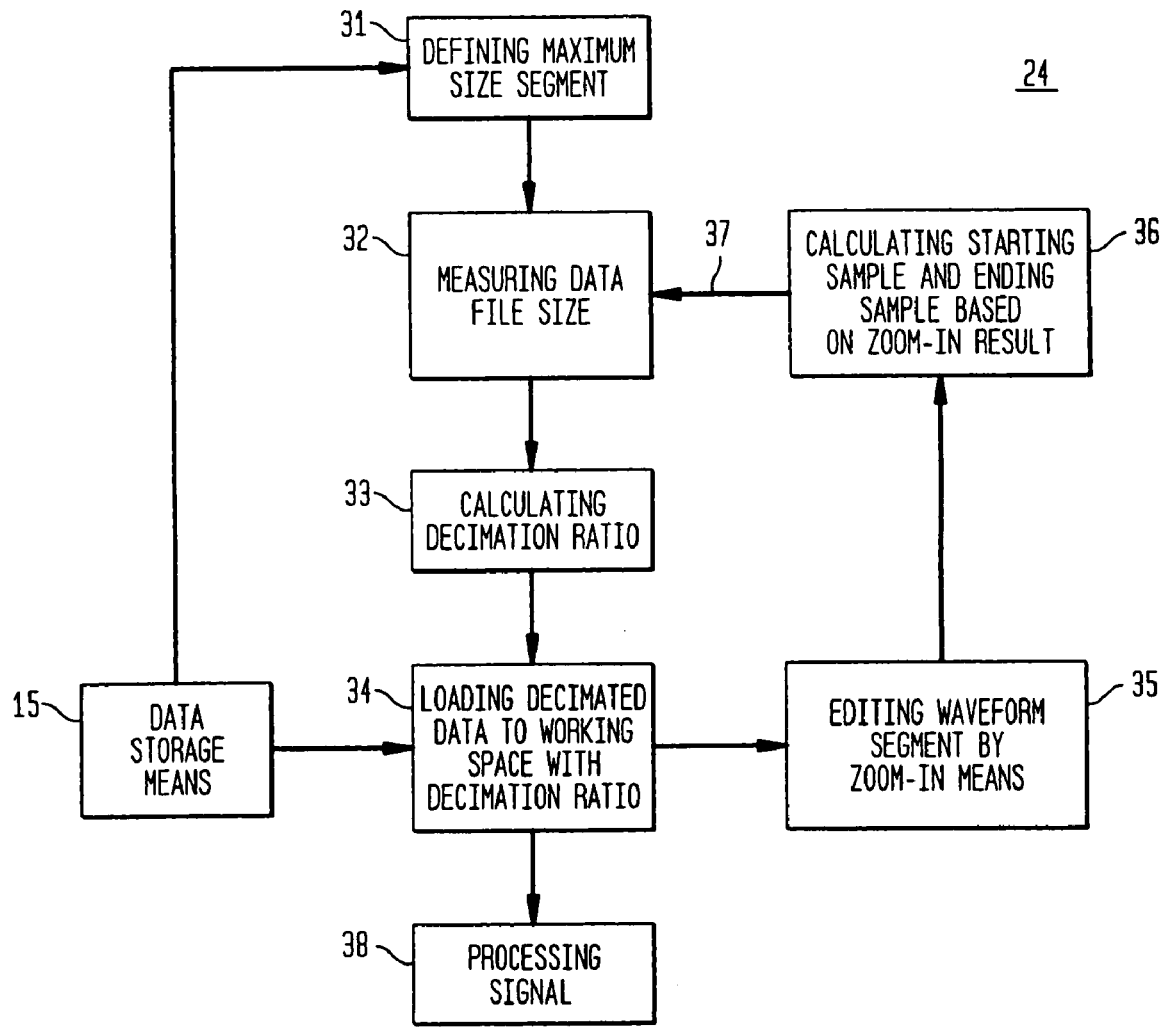
FIG. 3 is a block diagram illustrating the automatic decimation steps of the method of the present invention.

For a given data file that contains a digitally sampled signal, a data segment in the file is defined by the starting data sample and the ending data sample, and the devices, methods and software of the present invention isolate the data between the starting data sample and ending data sample thorough a process of decimating the data file to a more manageable and workable size that is compatible with a working space buffer of the data processing means 17. FIG. 3 is a block diagram depicting the software operations used in extracting and editing data files with an automatically adjusted decimation ratio in the means for decimating data files 24.

Referring now to FIG. 3, the decimating means 24 further comprises a means for defining the size of a maximum size data segment, as represented by Block 31, the working space buffer having a limited size, a means for measuring a data file, represented by Block 32, determines if the data file exceeds the limited buffer size, a means for calculating, which is represented by Block 33, calculates the first decimation ratio for fitting the data file into the working space buffer. In Block 34, the decimating means 24 provides a decimated data file, and the decimated data file and the decimation ratio are loaded directly from the data storage means 15 into the working space buffer. Block 35 illustrates a means for editing data files that extracts the desired data segment from the decimated data files and a means for zooming-in that edits the desired data segment. The calculating means, represented by Block 36, automatically adjusts the decimation ratio based on the starting and ending samples. The decimating means 24 decimates the desired data segment and provides a decimated data segment, represented by arrow 37 that fits into the working space buffer, and the decimated data segment 37 is loaded into the working space buffer to provide an improved resolution data segment for further signal processing and display on a means for display, represented by Block 38. Additionally, the signal monitor device of this invention also encompasses rapidly extracting and editing signal data sample files.

The operation of the decimating software of the decimating means 24 is described in further detail as part of this invention's method for rapidly extracting a data signal sample with an automatically adjusted decimation ratio for signal monitoring. The method for rapidly extracting a data file sample begins with the connecting, signal collecting, digitizing, data storing, sending and GUI operation steps already described in connection with FIG. 1. Referring back to FIG. 3, Block 31 represents a defining step, in which a maximum size data segment is defined based on the available or preferable buffer size. The maximum size data segment is chosen in order to view the entire data file, such as a signal waveform envelope of data samples without exceeding the limit of the buffer. This is done by editing, including zoom-in or zoom-out operations. Block 32 represents the measuring step, during which the actual size of data file is measured at each looping process before the decimation ratio is calculated and the decimated data file is loaded into the working space buffer.

The data file in the maximum size data segment can either be composed of real data or complex data and the appropriate decimation ratio will be calculated for each type of data. A real number has only one data sample, i.e. the real sample, but the complex number has two data samples, which are a real data sample and an imaginary data sample. In the first case of the real number, where $d_i$ is a real data sample in the data file, and i=1, 2, . . . , $L_1$ is an integer, the following equation represents a data file segment with M data samples that is loaded into a computer's working space buffer for processing:

$$d_p, d_{p+1}, d_{p+2}, \ldots, d_{p+M-1}, p \geq 1, p+M-1 \leq L_1, \text{ and } M \gg 1, \quad (1)$$

If the data has B bytes resolution per sample, we have M×B bytes for M samples in the segment. Block 33 represents the first calculating step, during which a first decimation ratio is calculated that permits a decimated data sample to fit into the working space buffer, and then is adjusted later with a second decimation ratio. Calculating the decimation ratio is based on the data and buffer sizes. Furthermore, if the buffer has only limited W bytes of space and W<<M×B, maximum size segment defined in the Block 31 defining step, then M data samples will be decimated to a smaller size in order to fit the buffer in accordance with the present invention. During the Block 33 first calculating step, the real data decimation ratio $R_1$ will be calculated according to the following equation:

$$R_1 = \begin{cases} 1 & \text{if } R_{10} = 0 \\ R_{10} & \text{if } R_{10} \geq 1 \end{cases} \text{ where } R_{10} = \text{ceil}\left(\frac{M}{W_1}\right) W_1 = \text{floor}\left(\frac{W}{B}\right) \quad (2)$$

where the operator ceil(x) rounds the elements of x to the nearest integers towards infinity, the operator floor(x) rounds the input data x to the nearest integers towards minus infinity and the buffer size W is defined by the user based on the application. The M data samples in Equation 2 will be decimated to a W number of decimated data samples according to this equation:

$$D_1 = [d_p \, d_{p+R_1} \, d_{p+2R_1} \ldots d_{p+(w-1)R_1}]^T \quad (3)$$

with the real data decimation ratio of $R_1$, where T represents matrix transpose. The real data decimation ratio $R_1$ will be calculated adaptively using Equation 2 and the vector $D_1$ will be updated whenever the parameters p or M vary.

In the case of complex data, the data file is denoted by $d_{i1}+jd_{i2}$, where i=1, 2, . . . , $L_2$ are integers and $L_2$ is an even integer, and each sample in the data file has a pair of elements as follows:

$$d_{q,1}, d_{q,2}, d_{q+1,1}, d_{q+1,2}, \ldots, d_{q+N-1,1}, d_{q+N-1,2}, q \geq 1, \\ q+N-1 \leq L_2, \text{ and } N \gg 1 \quad (4)$$

If the data has B bytes resolution per sample, we have 2N×B bytes for N number of complex data samples. If the working space buffer has only limited W bytes of space and W<<N, the N number of complex data samples will be decimated to a smaller size in order to fit the working space buffer in accordance with the methods of this invention. The complex data decimation ratio $R_2$ will be calculated according to the following equation:

$$R_2 = \begin{cases} 1 & \text{if } R_{20} = 0 \\ R_{20} & \text{if } R_{20} \geq 1 \end{cases} \text{ where } R_{20} = \text{ceil}\left(\frac{N}{W_2}\right) W_2 = \text{floor}\left(\frac{W}{2B}\right) \quad (5)$$

The N-pair complex samples in equation 4 will be decimated to a $W_2$-pair of complex samples with the complex data decimation ratio of $R_2$. The N-pair samples in (4), can be defined by using indices p as shown in the following equation:

$$d_p, d_{p+1}, d_{p+2}, \ldots, d_{p+2N-1}, \text{ with } p \geq 1, p+2N-1 \leq L_2, \\ \text{ and } N \gg 1 \quad (6)$$

The decimated data of equation (6) will be represented by a $W_2$ by a two-dimensional matrix according to the equation:

$$D_2 = \begin{bmatrix} d_p & d_{p+2R_2} & d_{p+4R_2} & \cdots & d_{p+2(W_2-1)R_2} \\ d_{p+1} & d_{p+2R_2+1} & d_{p+4R_2+1} & \cdots & d_{p+2(W_2-1)R_2+1} \end{bmatrix}^T \quad (7)$$

The purpose of the decimation is to fit the oversized date into small buffer by assuming the envelope of a decimated signal is a lower resolution view of the envelope of the original over-sampled signal. Since the signal analysis is not formed during the first calculations step 33, the examination of Nyquist sampling rate will not be necessary at this stage.

Block 34 represents the loading step wherein the decimated data sample is loaded with the decimation ratio to the working space buffer for improved resolution processing in the Block 38 signal processing and display step, or the Blocks 35-37 repeated steps where further resolution is needed by applying the zoom-in editing means to extract the desired waveform segment. Data in the form of a decimated data sample will be loaded to working space with a starting sample, ending sample and the automatically adjusted decimation ratio after an editing step, represented by Block 35.

In many cases, a zoom-in operation will be needed to extract the desired data segment. During the Block 35 editing step, the desired data segment is extracted by the zoom-in editing means to achieve an improved resolution. Block 36 represents the second calculating step, during which a starting sample and an ending sample from the desired data segment are located in order to upgrade the automatically adjusted decimation ratio calculated during the first calculating step. Arrow 37 represents repeating the measuring, calculating and loading steps, as needed, to achieve an improved resolution data segment in the working space buffer for the signal processing and display step in Block 38. Thus, when the parameters p, M, and W are given, the desired data segment will be defined and the decimation ratio will be calculated.

In operation, data files will be decimated to lower resolution decimated data segment and then loaded directly from the data storage means 15 into the smaller working space buffer. During the Block 35 editing step, parameters p and M are varying and the automatically adjusted decimation ratio will be calculated adaptively when the starting sample and ending sample are calculated during the Block 36 second calculating step to give the highest available resolution for the desired data segment, and the desired data segment will be decimated to form a decimated data segment that is loaded to the working space buffer to form the improved resolution data segment for the user's further analysis to identify the signal with unknown contents. The desired data segment extracted from the previously decimated data files with the zoom-in means during the Block 36 second calculating step can be loaded directly from the data storage means 15 with the updated decimation ratio for processing an improved resolution data segment file during the Block 38 signal processing and display step. If the bandwidth of the signal is available or can be estimated, a Nyquist sampling rate will be calculated and the signal will be sampled to meet the Nyquist sampling requirement before the digital signal processing.

Figure 4A:
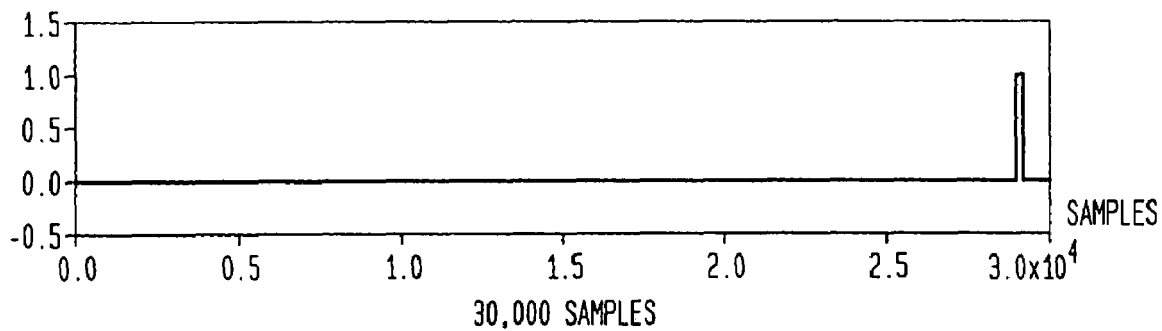
FIGS. 4A-4C are graphs illustrating one example of the decimation process of the present invention.
Figure 4B:
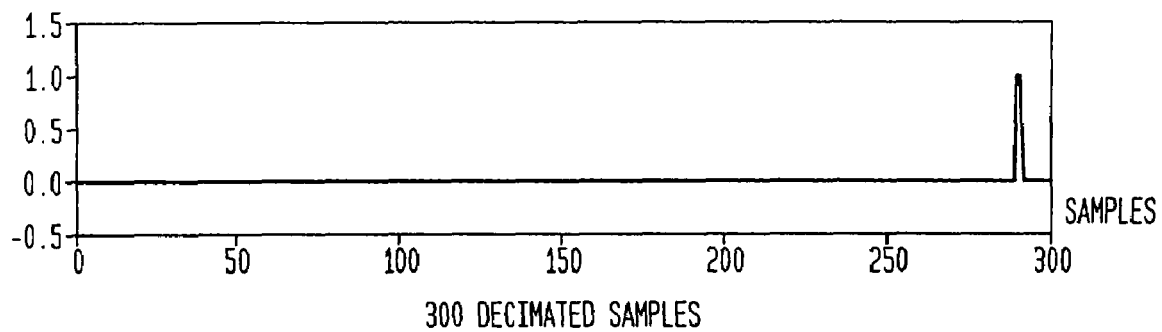
Figure 4C:
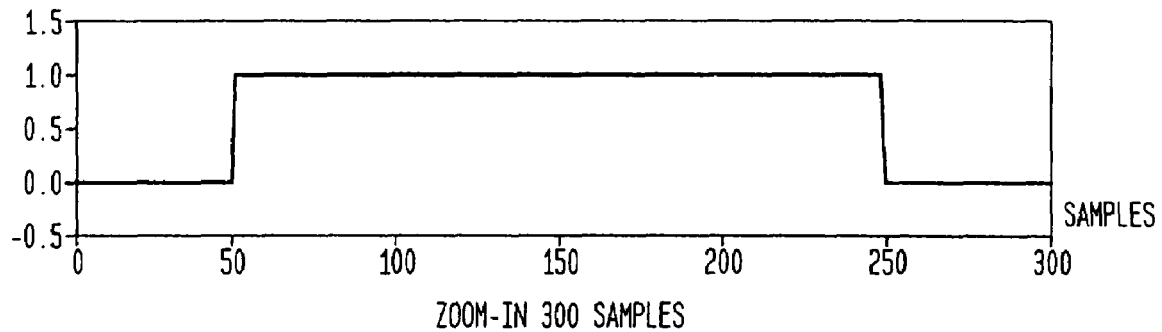

One example of the decimation methods of the present invention is illustrated by the graphs shown FIGS. 4A-4C. In this example, a pulse function segment of 10,000 data samples and a buffer size of 100 are shown. If the pulse function:

$$y(k)=u(k-t_1)-u(k-t_2)$$

where $t_2 > t_1$, (8)

is sampled to 10,000 samples, with 9,800 zeros and 200 ones, as shown in FIG. 4A, and the working space buffer can only hold 100 samples at a time. If the contents of the file are unknown, the user would be required to load 100 samples at a time until reaching the front edge of the pulse at sample 9001, because the first 9,000 samples have no information. Because the user is limited to examining only 100 samples at a time, the data segment can only hold half of the pulse and the waveform of the pulse function cannot be displayed. The user needs to find a decimation ratio to down sample the data segment before loading the data segment into the buffer, which is a very time-consuming process when the data file of y(k) is large. However, this invention's method will automatically load 100 samples directly from the data storage means 15 with 98 zeros and 2 ones with a decimation ratio of 100. When the sample data file is decimated the data by a ratio of 100, samples are picked from indices: 1, 101, 201, ..., until the end of the data file is reached. FIG. 4B depicts a low-resolution version of y(k). In many cases, the low-resolution y(k) may give sufficient envelope description for further analysis, and the user could conclude the operation with the FIG. 3 Block 38 data processing step. Whenever better resolution of the pulse function is required, the desired waveform segment can be extracted from the FIG. 4B data segment by the zoom-in means based on the user-defined boundary to load a new segment using hardware or software controlled by the FIG. 2 GUI. During the Block 36 second calculating step, a decimation ratio software module will calculate the decimation ratio accordingly based on new data segment size chosen by GUI and automatically reload 100 new samples directly from the data storage means 15 with higher resolution as depicted in FIG. 4C. The decimation methods of the present invention provide a much more convenient and efficient technique for analyzing large data files and data signal files in a limited size buffer, without suffering from the shortcomings, disadvantages and limitations of prior art methods and devices.

Figure 5A:
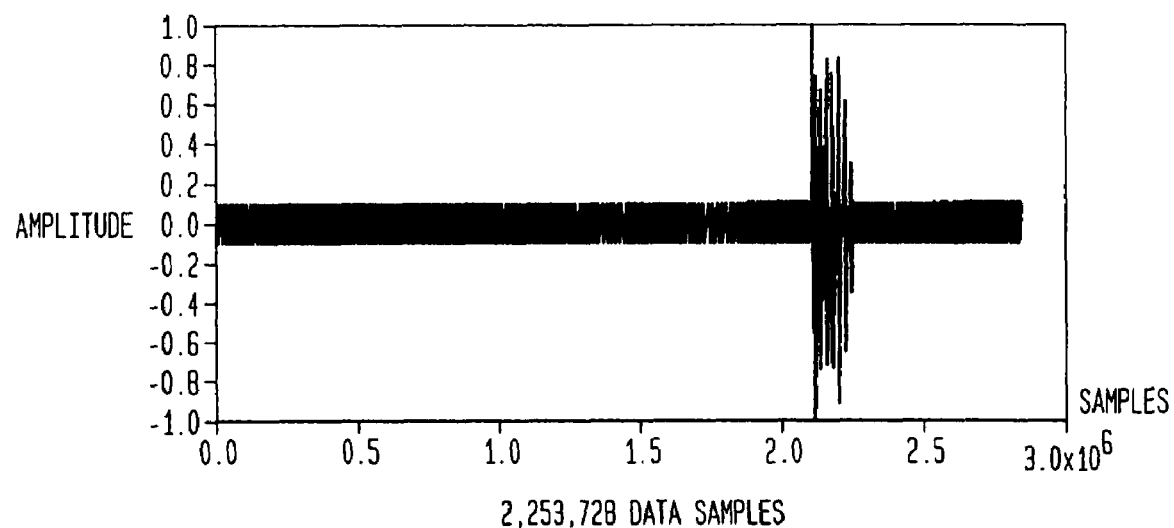
FIGS. 5A-5B are graphs illustrating an example of the decimation process of the present invention depicting a waveform of the human voice with a decimation ratio of 286.
Figure 5B:
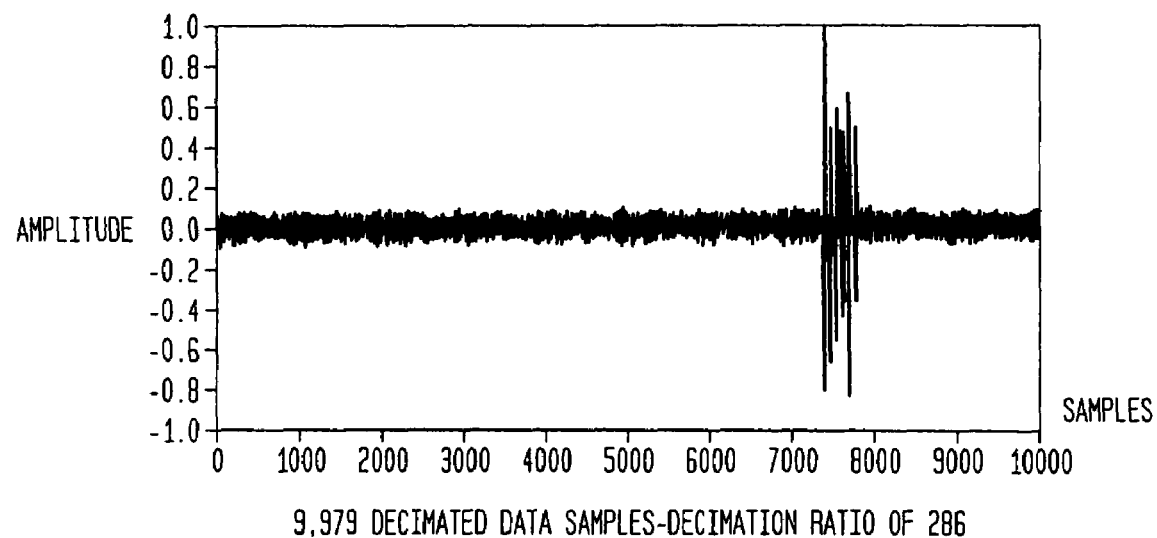

FIGS. 5A-7B depict a second example of the operation of the methods of the present invention based on analyzing a child's recorded voice. FIGS. 5A, 6A and 7A show the child's voice waveform with 2,853,728 data samples. Assuming that the working space buffer can only hold 10,000 samples at a time, the entire waveform of 2,253,728 samples depicted in FIG. 5A cannot fit into the working space buffer for waveform plotting. If the content of the waveform file is unknown before loading the data, the decimation methods of the present invention will automatically calculate the decimation ratio and load 9,979 samples directly from the data storage means 15 based upon a decimation ratio of 286 depicted in the FIG. 5B low-resolution version of the waveform. Although the memory space for the FIG. 5B waveform is 286 times smaller than the waveform depicted in FIG. 5A, it still faithfully represents the envelope of the original waveform especially when the waveform is over sampled in recording. The Block 35 zoom-in editing means can extract the signal from the FIG. 5B waveform by applying the zoom-in editing means to the FIG. 5B x-axis, time-axis or horizontal axis. The x-indices of zoom-in can be determined graphically.

The user may obtain x-indices by using either GUI or a text editor input. Then, the starting sample and the ending sample will be calculated based on the x-indices and the new waveform will be loaded from the data storage means 15 from the starting sample index to the ending sample index.

Figure 6A:
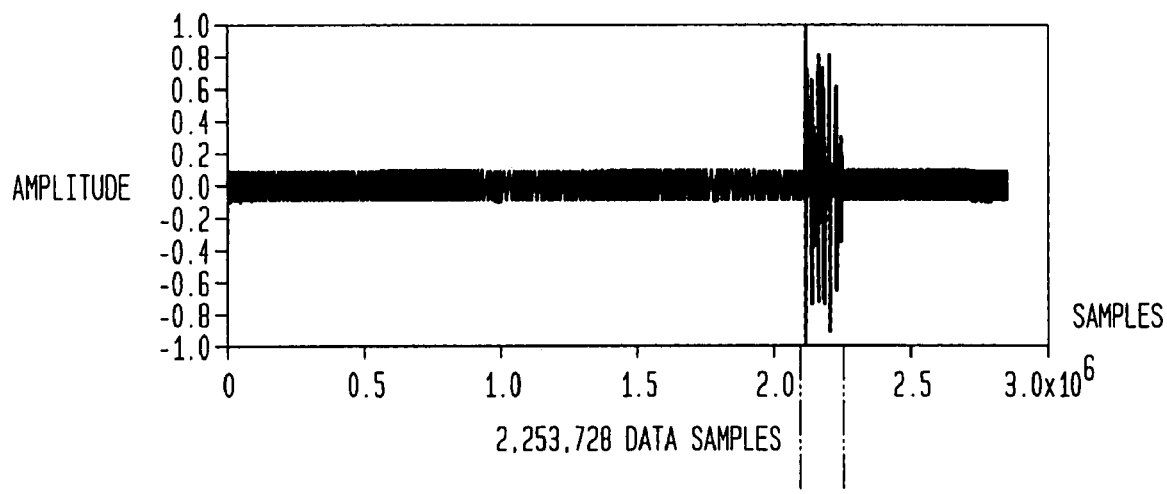
FIGS. 6A-6B are graphs further illustrating the human voice waveform example of the decimation process of the present invention depicting a waveform of the human voice with a decimation ratio of 14.
Figure 6B:
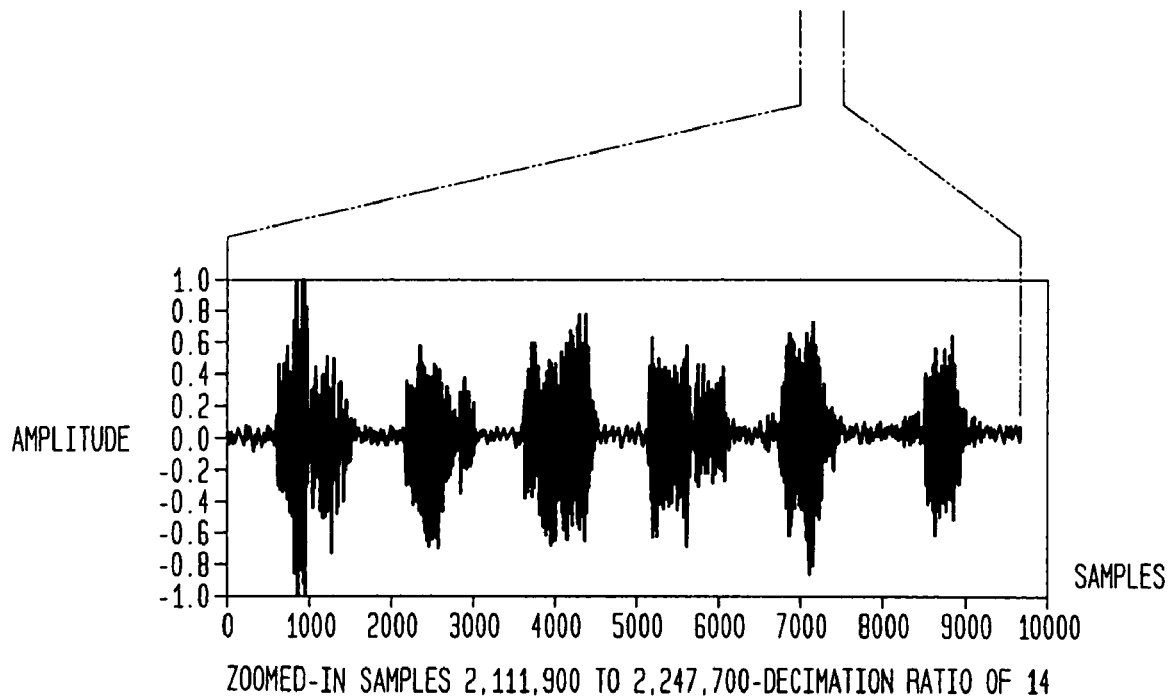

Referring now to FIG. 6B, the new waveform is loaded from sample 2,111,900 to sample 2,247,700 with a decimation ratio of 14. It should be noted that the FIG. 6B waveform has a much higher resolution than the FIG. 5B decimation ratio of 286. The FIG. 6B signal waveform has six bursts. In many applications, when only a single burst of the desired waveform segment is of interest, the zoom-in editing means can be used to load the first burst directly from the original waveform file from sample 2,122,001 to sample 2,132,000, as shown in FIG. 6B. Since the waveform has only 10,000 samples, the decimation will no longer be needed and a full resolution waveform will be presented. The decimation ratio is updated each time when the zoom-in editing means is operated, and the data samples in the working space buffer will always equal or be less than 10,000.

Figure 7A:
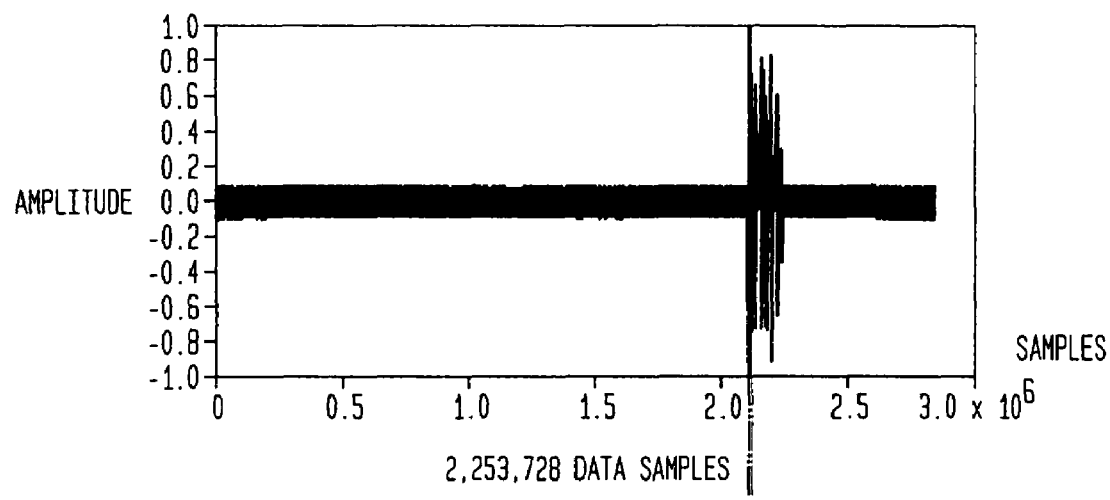
FIGS. 7A-7B are other graphs further illustrating the human voice waveform example of the decimation process of the present invention present invention depicting a waveform of the human voice at full resolution.
Figure 7B:
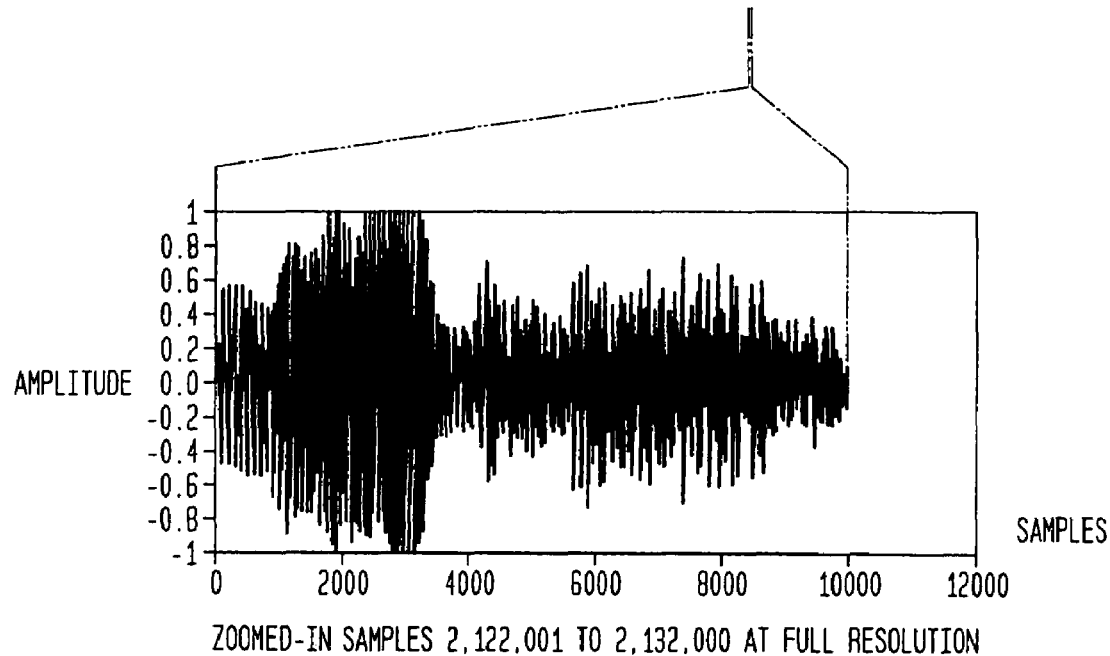

Referring now to FIG. 7B, that graph illustrates yet a higher resolution after employing the zoom-in editing means to extract the first burst from the original data file, starting from sample 2,122,001 to sample 2,132,000.

Figure 8:
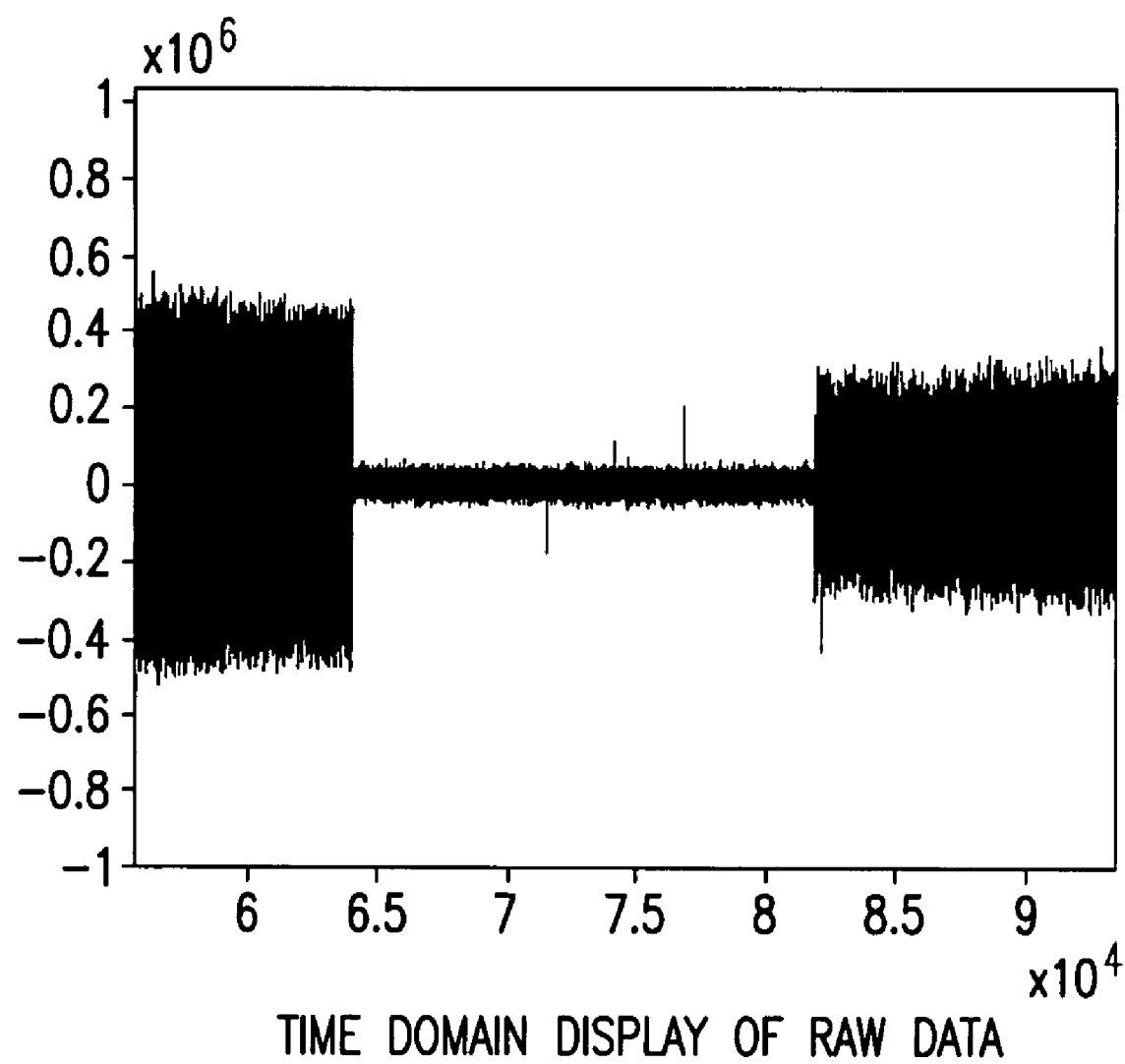
FIG. 8 is a graph illustrating a time domain display of an unknown signal.
Figure 9:
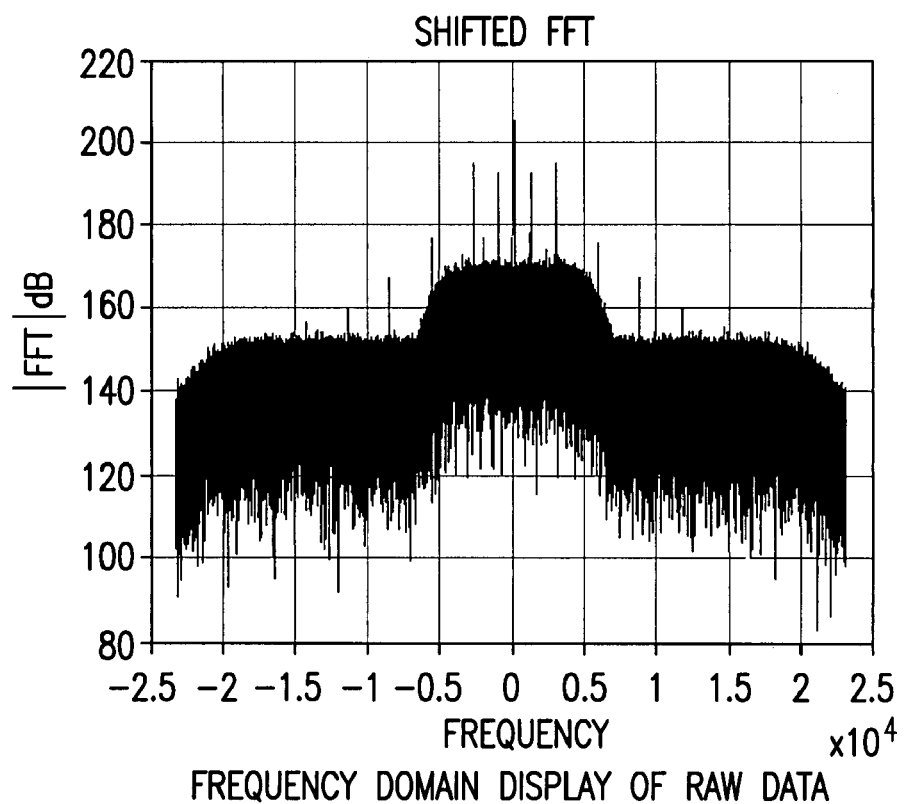
FIG. 9 is a graph illustrating a frequency-domain display of an unknown signal.
Figure 10:
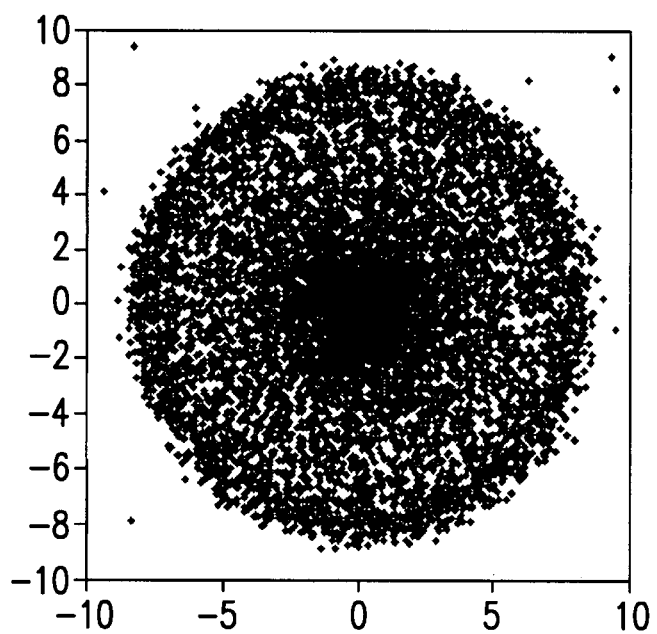
FIG. 10 is a graph illustrating an in-phase-and-quadrature (IQ) display of the unknown signal.

Other examples of the operation of the present invention are depicted in FIGS. 8-14. The collected raw data samples of an unknown signal can be displayed in time-domain display as shown in FIG. 8, in frequency-domain display as shown in FIG. 9, and in in-phase-and-quadrature (IQ) display, after automatic decimation, as shown in FIG. 10. It is noted that the FIG. 8 time-domain display consists of three waveform sections starting from left to right with a guiding sequence section, a noise section and a data section. In order to analyze the unknown data, frequency-domain display and IQ display will be used. However, the frequency-domain display in FIG. 9 and the IQ display in FIG. 10 are both contaminated by the guiding sequence and noise, and the signal feature will not be displayed properly. The invention uses the FIG. 2 GUI to take snapshots of waveform sections as shown in FIGS. 11-14.

Figure 11:
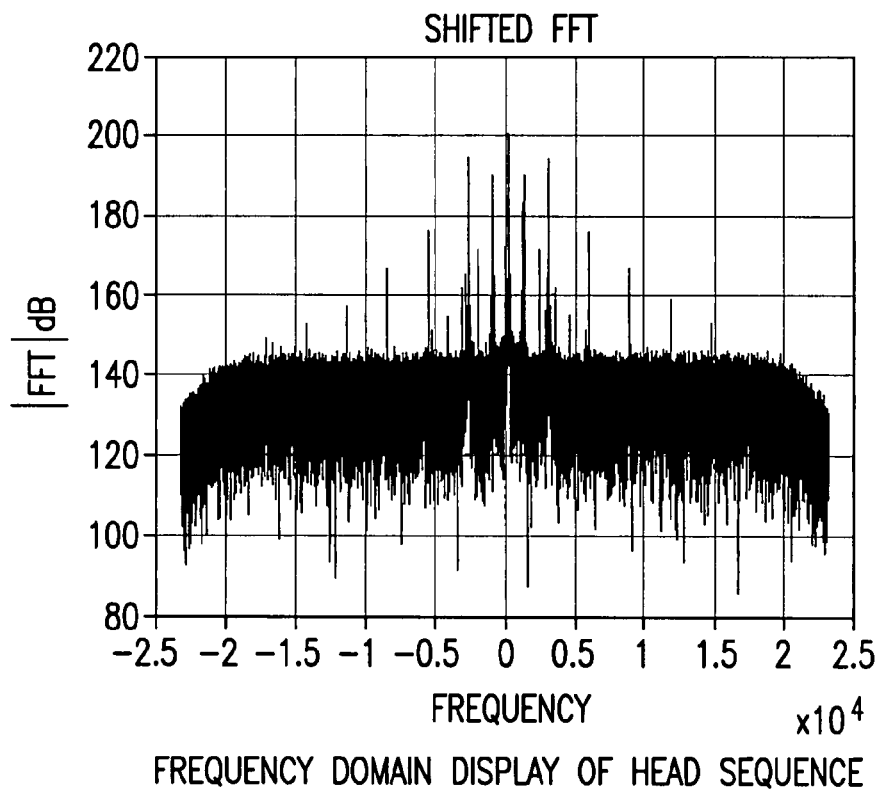
FIG. 11 is a graph illustrating an impulse-like spectrum display indicating a guiding sequence.
Figure 12:
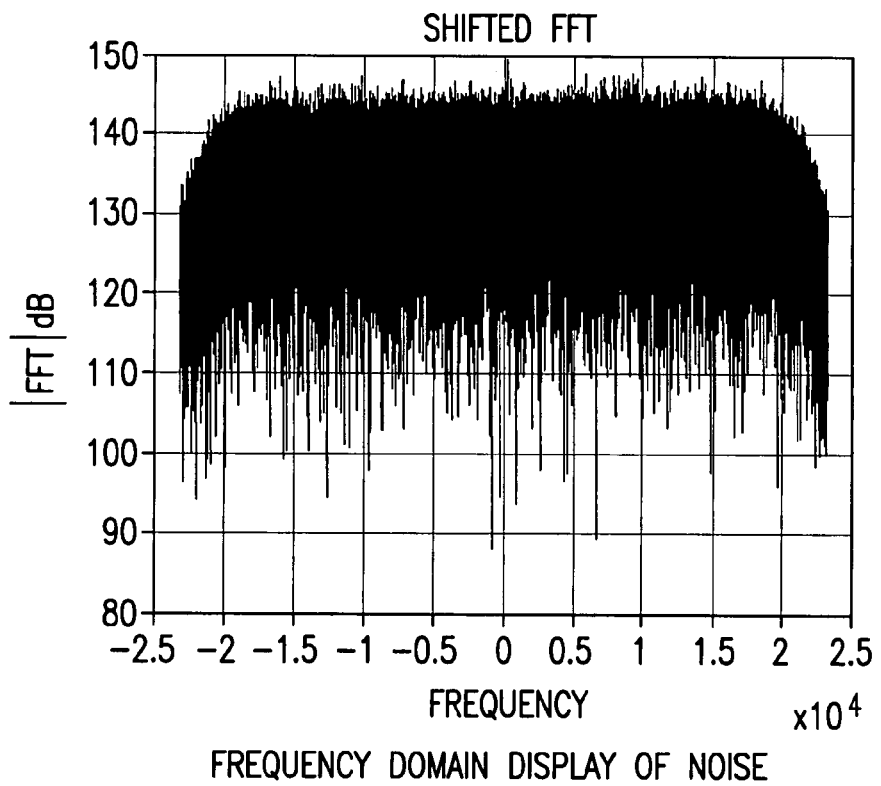
FIG. 12 is a graph illustrating a flat spectrum indicating the presence of white noise.
Figure 13:
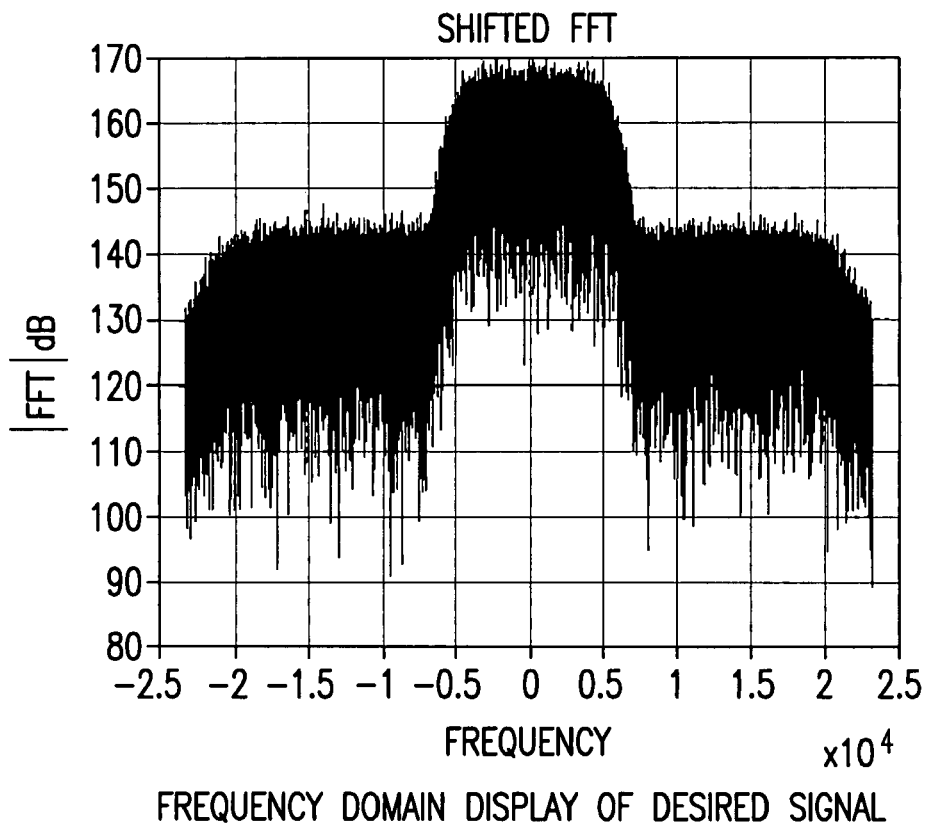
FIG. 13 is a graph illustrating a bell-shaped spectrum indicating a linearly modulated signal will be extracted in FIG. 1 Box 20 for center-frequency removal and down-sampling in accordance with the present invention.
Figure 14:
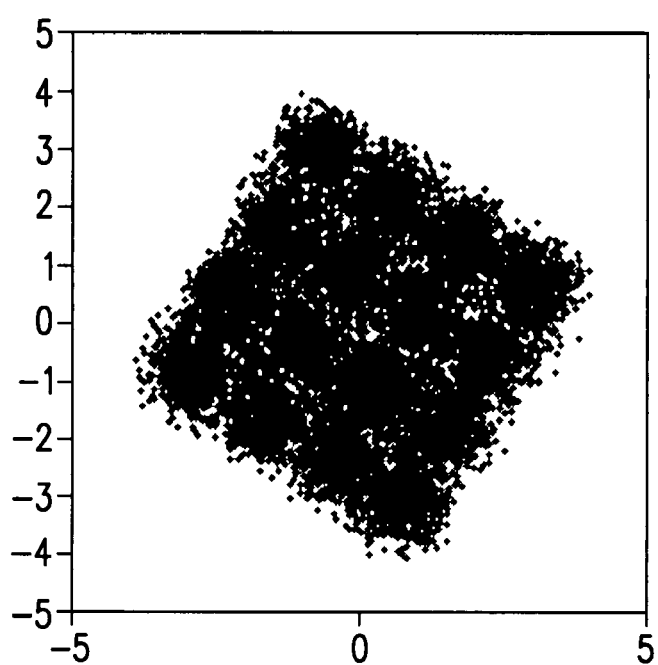
FIG. 14 is a graph illustrating an IQ display of the desired section in accordance with the present invention.

Since the detailed snapshots with all signal features are much smaller in size as compared to the raw data samples, the software automatically recalculates the decimation rate in every resizing, or zooming, step, and loads the snapshot section into a display means. We can observe that the uncontaminated frequency-domain displays have been obtained as shown in FIGS. 11-13, where FIG. 11 shows the impulse-like spectrum which indicates the feature of a guiding sequence, where FIG. 12 shows the flat spectrum which indicates the feature of white noises and where FIG. 13 shows the bell-shaped spectrum which indicates the feature of a linearly modulated signal. Since the modulated signal is the desired section for further signal analysis and feature extraction, it is sent to the Block 38 signal processing and display step for center-frequency removal and down-sampling. An IQ display of the desired section after extraction and processing is shown in FIG. 14, which demonstrates a shifted square pattern consists of 16 noisy clusters. The shifted clusters are important modulation features for classifying an unknown signal. The shift shows the signal has an initial modulation phase of 58 degrees, and the 16 noisy clusters indicate that the signal has a modulation scheme of 16QAM. Comparing the raw data in FIGS. 11-13 with the processed data in FIG. 9, and raw data in FIG. 14 with the processed data in FIG. 12 those skilled in the art will readily observe this invention's significant improvements over the prior art. As a result, the unknown raw signal data is identified as a 16QAM modulated signal by using the GUI based computer aided editing. The software is running automatically according to GUI instructions. At this stage, many further signal identification techniques can be easily employed.

The methods of the present invention can also include a number of variations that are similar to the variations for the signal monitor device such as repeating the calculating, decimating and loading steps as needed to achieve better resolution. Other variations include the steps of analyzing real data, calculating a real data decimation ratio $R_1$, extracting complex data, calculating a complex data decimation ratio $R_2$ and so forth. Additionally, the methods of the present invention also contemplate rapidly extracting and editing both data file samples and data signal samples with an automatically adjusted decimation ratio.

The present invention can be embodied in the form of computer-implemented processes and apparatuses for practicing those processes. The present invention can also be embodied in the form of computer program code embodied in tangible media, such a floppy diskettes, CD-ROM's, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling through fiber optics, or via electromagnetic radiation, wherein when the computer program code is loaded and executed by a computer, the computer becomes an apparatus for practicing the invention. When implemented on a general-purpose microprocessor, the computer program code segments combine with the microprocessor to provide a unique device that operates analogously to specific logic circuits.

The present invention also encompasses a storage medium encoded with machine-readable computer program code for rapidly extracting data file samples from an unknown signal with automatically adjusted decimation ratios for signal monitoring. Referring back to FIGS. 1-2, the computer program embodiment of this invention comprises an antenna 11, communication receiver 12 to collect the signal with unknown contents, a means for over-sampling 13 providing a digitized data sample 14 stored in a data storage means 15. A stored digitized data sample 16, is sent to a data processing means 17. The data processing means 17 further comprises a signal decimation module 18, data buffer 19 and a signal analyzer 20 that provides a signal analysis output 21 to a GUI 22 and a decimation rate output 23 to the decimation means 24. Referring now to FIG. 3 a means for causing the computer to define a maximum size data segment defines a maximum size data segment Block 31, a means for causing the computer to measure data files Block 32 determines if the data file exceeds the limited working space buffer size and a first means for calculating Block 33 calculates the automatically adjusted decimation ratio for fitting the data file into the working space buffer. A means for causing the computer to decimate the data file 24 retrieves the data file from a data storage means 15 and provides a decimated data file, and the decimated data file is loaded into the working space buffer, as represented by Block 34, a means for causing the computer to edit data files extracts a desired data segment from the decimated data files and a means for zooming-in Block 35 edits the desired data segment. Block 36 represents a second calculating means calculating a starting sample and an ending sample of the desired data segment. The second calculating means automatically adjusts the decimation ratio based on the starting and ending samples, the decimating means 24 decimates the desired data segment and provides a decimated data segment fitting the working space buffer, and loading the decimated data segment into the working space buffer provides an improved resolution data segment for signal processing, editing and further identification of the unknown signal. Additionally, the computer program embodiment of this invention also encompasses rapidly analyzing and editing either data file samples or data signal file samples.

The variations in method of the present invention also apply to the computer program and apparatus embodiments of this invention. The signal monitor device embodiment of this invention may be a means for data processing, a computer or hardware.

It is to be further understood that other features and modifications to the foregoing detailed description are within the contemplation of the present invention, which is not limited by this detailed description. Those skilled in the art will readily appreciate that any number of configurations of the present invention and numerous modifications and combinations of materials, components, arrangements and dimensions can achieve the results described herein, without departing from the spirit and scope of this invention. Accordingly, the present invention should not be limited by the foregoing description, but only by the appended claims.

I claim:

1. A signal monitoring device for rapidly extracting a data file sample from an unknown signal with automatically adjusted decimation ratios, comprising:
   an antenna connected to a communications receiver;
   said communications receiver collects said unknown signal;
   said unknown signal having a plurality of analog data;
   a means for over-sampling digitizes said plurality of analog data to provide a digitized data sample to a means for data storage;
   a stored digitized data sample is sent to a means for data processing, said data processing means further comprising a signal decimation module, a data buffer, a signal analyzer, and a working space buffer working space buffer having a limited size;
   said signal analyzer provides a signal analysis output to a Graphic Users Interface (GUI), said GUI reports a maximum number of samples to define a starting sample and an ending sample of said digitized data sample;
   said signal analyzer provides a decimation rate output to a means for decimating data files, said decimating means provides a decimated data sample;
   a means calculating calculates a first decimation ratio for said limited size of the working space buffer;
   said decimated data sample and said first decimation ratio being loaded into said working space buffer;
   a desired data segment is selected from said decimated data sample;
   said calculating means calculates said starting sample and said ending sample to include said desired data segment;
   a means for zooming-in extracts said desired data segment from between said starting sample and said ending sample;
   said calculating means automatically calculates a second decimation ratio to adjust said first decimation ratio; and
   said decimating means decimates said desired data segment with said second decimation ratio and generates a decimated data segment that is loaded into said working space buffer and provides an improved resolution data segment for further signal processing and display on a means for display allowing a user to rapidly and accurately identify said unknown signal.

2. The signal monitoring device for rapidly extracting the data file sample from the unknown signal with the automatically adjusted decimation ratios, as recited in claim 1, further comprising:
   said data file sample being composed of real data;
   said calculating means calculates a real data decimation ratio $R_1$ according to the following equation:

$$R_1 = \begin{cases} 1 & \text{if } R_{10} = 0 \\ R_{10} & \text{if } R_{10} \geq 1 \end{cases}, \text{ where } R_{10} = \text{ceil}\left(\frac{M}{W_1}\right) W_1 = \text{floor}\left(\frac{W}{B}\right);$$

and;
   where said M is the number of data samples, said B is the number of bytes resolution per sample an operator ceil (x) rounds the elements of x to the nearest integers towards infinity, an operator floor(x) rounds the input data x to the nearest integers towards minus infinity, and a buffer size W is defined by the user.

3. The signal monitoring device for rapidly extracting the data file sample from the unknown signal with the automatically adjusted decimation ratios, as recited in claim 2, further comprising said decimating means decimating an M number of said data file sample to a W number of said decimated data samples according to the equation:

$$D_1 = [d_p \, d_{p+R_1} \, d_{p+2R_1} \ldots d_{p+(W-1)R_1}]^T$$

with said real data decimation ratio of $R_1$, where said $D_1$ is a vector, said T represents a matrix transpose, said d is a data sample, and said p is $\geq 1$.

4. The signal monitoring device for rapidly extracting the data file sample from the unknown signal with the automatically adjusted decimation ratios, as recited in claim 1, further comprising:
   said data file sample being composed of complex data;
   said complex data being denoted by an equation $d_{j1}+jd_{j2}$, where said i=1, 2, ..., $L_2$ are integers and said $L_2$ is an even integer, where each of a plurality of data file samples having a pair of elements according to the formula:

$$d_{q,1}, d_{q,2}, d_{q+1,1}, d_{q+1,2}, \ldots, d_{q+N-1,1}, d_{q+N-1,2}, q \geq 1,$$
$$q+N-1 \leq L_2, \text{ and } N >> 1; \text{ and}$$

an N number of complex data samples are provided.

5. The signal monitoring device for rapidly extracting the data file sample from the unknown signal with the automatically adjusted decimation ratios, as recited in claim 4, further comprising said calculating means calculating a complex data decimation ratio $R_2$ according to the following equation:

$$R_2 = \begin{cases} 1 & \text{if } R_{20} = 0 \\ R_{20} & \text{if } R_{20} \geq 1 \end{cases} \text{ where } R_{20} = \text{ceil}\left(\frac{N}{W_2}\right) W_2 = \text{floor}\left(\frac{W}{2B}\right)$$

with said expression ceil($N/W_2$) being an operator rounding ($N/W_2$) to the nearest integers toward infinity, said expression floor(W/2B) being an operator rounding (W/2B) to the nearest integers toward minus infinity, said B being the number of bytes resolution per sample, and said W being a buffer size defined by the user.

6. The signal monitoring device for rapidly extracting the data file sample from the unknown signal with the automatically adjusted decimation ratios, as recited in claim 1, further comprising said data file sample being a data signal file.

7. The signal monitoring device for rapidly extracting the data file sample from the unknown signal with the automatically adjusted decimation ratios, as recited in claim 6, further comprising:
   said desired data segment is a desired waveform segment;
   said decimated data segment is a decimated waveform segment; and
   said improved resolution data segment is an improved resolution data signal segment.

8. A method for rapidly extracting a data file sample from an unknown signal with a signal monitor and automatically adjusted decimation ratios, comprising the steps of:
   connecting an antenna to a communications receiver;
   collecting said unknown signal, said unknown signal having a plurality of analog data;
   digitizing said plurality of analog data with a means for over-sampling;

storing a digitized data sample in a means for data storage;

sending said digitized data sample to a means for data processing, said data processing means further comprising a signal decimation module, a data buffer, a signal analyzer, and a working space buffer working space buffer having a limited size;

providing a signal analysis output from said signal analyzer to a Graphic Users Interface (GUI), said GUI reports a maximum number of samples to define a starting sample and an ending sample of said digitized data sample;

sending a decimation rate output from said signal analyzer to a means for decimating data files;

decimating said digitized data sample in said decimating means to form a decimated data sample;

calculating a first decimation ratio for said limited size of the working space buffer with a means for calculations;

loading said decimated data sample and said first decimation ratio into said working space buffer;

selecting a desired data segment from said decimated data sample;

calculating a starting sample and an ending sample that includes said desired data segment with said calculating means;

extracting said desired data segment from between said starting sample and said ending sample with a means for zooming-in;

calculating a second decimation ratio to automatically adjust said first decimation ratio; and decimating said desired data segment in said decimating means with said second decimation ratio to form a decimated data segment that is loaded into said working space buffer and provides an improved resolution data segment for further signal processing and display on a means for display allowing a user to rapidly and accurately identify said unknown signal.

9. The method for rapidly extracting the data file sample from the unknown signal with the signal monitor and automatically adjusted decimation ratios, as recited in claim 8, further comprising the steps of:

forming said data file sample from real data;

calculating a real data decimation ratio $R_1$ according to the equation:

$$R_1 = \begin{cases} 1 & \text{if } R_{10} = 0 \\ R_{10} & \text{if } R_{10} \geq 1 \end{cases} \text{ where } R_{10} = \text{ceil}\left(\frac{M}{W_1}\right) W_1 = \text{floor}\left(\frac{W}{B}\right);$$

where said M is the number of data samples, said B is the number of bytes resolution per sample, an operator ceil (x) rounds the elements of x to the nearest integers towards infinity, an operator floor(x) rounds the input data x to the nearest integers towards minus infinity, and a buffer size W is defined by the user; and decimating an M number of said data files to a W number of said decimated data samples according to the equation:

$$D_1 = [d_p \; d_{p+R_1} \; d_{p+2R_1} \ldots d_{p+(W-1)R_1}]^T$$

with said real data decimation ratio of $R_1$, where said $D_1$ is a vector, said T represents a matrix transpose, said d is a data sample, and said p is $\geq 1$.

10. The method for rapidly extracting the data file sample from the unknown signal with the signal monitor and automatically adjusted decimation ratios, as recited in claim 8, further comprising the steps of:

forming said data file sample from complex data; and denoting said complex data by an equation $d_{i1} + j d_{i2}$, where said i=1, 2, . . . , $L_2$ are integers and said $L_2$ is an even integer, with each of a plurality of data file samples having a pair of elements according to the formula:

$$d_{q,1}, d_{q,2}, d_{q+1,1}, d_{q+1,2}, \ldots, d_{q+N-1,1}, d_{q+N-1,2}, \; q \geq 1,$$
$$q+N-1 \leq L_2, \text{ and } N >> 1; \text{ and}$$

providing an N number of complex data samples.

11. The method for rapidly extracting the data file sample from the unknown signal with the signal monitor and automatically adjusted decimation ratios, as recited in claim 10, further comprising the step of calculating a complex data decimation ratio $R_2$ according to the following equation:

$$R_2 = \begin{cases} 1 & \text{if } R_{20} = 0 \\ R_{20} & \text{if } R_{20} \geq 1 \end{cases} \text{ where } R_{20} = \text{ceil}\left(\frac{N}{W_2}\right) W_2 = \text{floor}\left(\frac{W}{2B}\right)$$

with said expression ceil(N/$W_2$) being an operator rounding (N/$W_2$) to the nearest integers toward infinity, said expression floor(W/2B) being an operator rounding (W/2B) to the nearest integers toward minus infinity, said B being the number of bytes resolution per sample, and said W being a buffer size defined by the user.

12. The method for rapidly extracting the data file sample from the unknown signal with the signal monitor and automatically adjusted decimation ratios, as recited in claim 8, wherein said data file sample is a data signal file.

13. The method for rapidly extracting the data file sample from the unknown signal with the signal monitor and automatically adjusted decimation ratios, as recited in claim 12, wherein:

said desired data segment is a desired waveform segment;

said decimated data segment is a decimated waveform segment; and said improved resolution data segment is an improved resolution data signal segment.

14. A signal monitoring article of manufacture for rapidly extracting a data file sample from an unknown signal, comprising:

an antenna connected to a communications receiver;

said communications receiver collects said unknown signal;

said unknown signal having a plurality of analog data;

a means for over-sampling digitizes said plurality of analog data to provide a digitized data sample to a means for data storage;

a stored digitized data sample is sent to a computer, said computer further comprising a signal decimation module, a data buffer, a signal analyzer, a storage medium encoded with machine-readable computer program code, and a working space buffer having a limited size;

said machine-readable computer program code provides a plurality of machine-readable instructions to said computer;

said signal analyzer provides a signal analysis output to a Graphical Users Interface (GUI), said GUI reports a maximum number of samples to define a starting sample and an ending sample;

said signal analyzer provides a decimation rate output to a means for decimating data files, said decimating means provides a decimated data sample;

a means for calculating calculates a first decimation ratio for said limited size of the working space buffer;

said decimated data sample and said first decimation ratio being loaded into said working space buffer;

a desired data segment is selected from said decimated data sample;

said calculating means calculates said starting sample and said ending sample to include said desired data segment;

a means for zooming-in extracts said desired data segment from between said starting sample and said ending sample;

said calculating means automatically calculates a second decimation ratio to adjust said first decimation ratio; and said decimating means decimates said desired data segment with said second decimation ratio and generates a decimated data segment that is loaded into said working space buffer and provides an improved resolution data segment for further signal processing and display on a means for display allowing a user to rapidly and accurately identify said unknown signal.

15. The signal monitoring article of manufacture for rapidly extracting the data file sample from the unknown signal, as recited in claim 14, further comprising:

said data file sample being composed of real data; and said calculating means calculates a real data decimation ratio $R_1$ according to the equation:

$$R_1 = \begin{cases} 1 & \text{if } R_{10} = 0 \\ R_{10} & \text{if } R_{10} \geq 1 \end{cases} \text{ where } R_{10} = \text{ceil}\left(\frac{M}{W_1}\right) W_1 = \text{floor}\left(\frac{W}{B}\right);$$

and, where said M is the number of data samples, said B is the number of bytes resolution per sample, an operator ceil (x) rounds the elements of x to the nearest integers towards infinity and an operator floor(x) rounds the input data x to the nearest integers towards minus infinity, and a buffer size W is defined by the user.

16. The signal monitoring article of manufacture for rapidly extracting the data file sample from the unknown signal, as recited in claim 15, further comprising said decimating means decimating an M number of said data files to a W number of said decimated data samples according to the equation:

$$D_1 = [d_p \, d_{p+R_1} \, d_{p+2R_1} \ldots d_{p+(W-1)R_1}]^T$$

with said real data decimation ratio of $R_1$, where said where said $D_1$ is a vector said T represents a matrix transpose, said d is a data sample, and said p is $\geq 1$.

17. The signal monitoring article of manufacture for rapidly extracting the data file sample from the unknown signal, as recited in claim 14, further comprising:

said data file sample being composed of complex data;

said complex data being denoted by an equation $d_{j1}+jd_{j2}$, where said i=1, 2, ..., $L_2$ are integers and said $L_2$ is an even integer, with each of a plurality of data file samples having a pair of elements according to the formula:

$$d_{q,1}, d_{q,2}, d_{q+1,1}, d_{q+1,2}, \ldots, d_{q+N-1,1}, d_{q+N-1,2}, \, q \geq 1,$$
$$q+N-1 \leq L_2, \text{ and } N \gg 1; \text{ and}$$

an N number of complex data samples are provided.

18. The signal monitoring article of manufacture for rapidly extracting the data file sample from the unknown signal, as recited in claim 17, further comprising said calculating means calculating a complex data decimation ratio $R_2$ according to the following equation:

$$R_2 = \begin{cases} 1 & \text{if } R_{20} = 0 \\ R_{20} & \text{if } R_{20} \geq 1 \end{cases} \text{ where } R_{20} = \text{ceil}\left(\frac{N}{W_2}\right) W_2 = \text{floor}\left(\frac{W}{2B}\right)$$

with said expression ceil($N/W_2$) being an operator rounding ($N/W_2$) to the nearest integers toward infinity, said expression floor(W/2B) being an operator rounding (W/2B) to the nearest integers toward minus infinity, said B being the number of bytes resolution per sample, and said W being a buffer size defined by the user.

19. The signal monitoring article of manufacture for rapidly extracting the data file sample from the unknown signal, as recited in claim 14, further comprising said data file sample being a data signal file.

20. The signal monitoring article of manufacture for rapidly extracting the data file sample from the unknown signal, as recited in claim 19, further comprising:

said desired data segment being a desired waveform segment;

said decimated data segment being a decimated waveform segment; and said improved resolution data segment being an improved resolution data signal segment.

\* \* \* \* \*